US009409264B2

(12) United States Patent
Gilliland et al.

(10) Patent No.: US 9,409,264 B2
(45) Date of Patent: Aug. 9, 2016

(54) INTERLEAVED HEAT SINK AND FAN ASSEMBLY

(71) Applicant: International Business Machines Corporation, Armonk, NY (US)

(72) Inventors: Don A. Gilliland, Rochester, MN (US); David B. Johnson, Seattle, WA (US); Phillip V. Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 13/849,725

(22) Filed: Mar. 25, 2013

(65) Prior Publication Data

US 2014/0284030 A1    Sep. 25, 2014

(51) Int. Cl.
| H05K 7/20 | (2006.01) |
| B23P 15/26 | (2006.01) |
| H01L 23/367 | (2006.01) |
| H01L 23/467 | (2006.01) |

(52) U.S. Cl.
CPC ............ *B23P 15/26* (2013.01); *H01L 23/3672* (2013.01); *H01L 23/467* (2013.01); *H01L 2924/0002* (2013.01); *Y10T 29/4935* (2015.01)

(58) Field of Classification Search
CPC .... H05K 7/20; H05K 7/20136; H05K 7/2039
USPC ............. 165/127, 120, 121, 122, 58, 59, 185; 361/697
See application file for complete search history.

(56) References Cited

U.S. PATENT DOCUMENTS

| 3,844,341 | A | * | 10/1974 | Bimshas et al. ................ 165/86 |
| 5,000,254 | A | * | 3/1991 | Williams ........................ 165/85 |
| 5,297,623 | A | * | 3/1994 | Ogushi et al. ................. 165/121 |
| 5,335,143 | A | | 8/1994 | Maling, Jr. et al. |
| 5,794,687 | A | | 8/1998 | Webster, Jr. et al. |
| 7,113,403 | B2 | * | 9/2006 | Kuo et al. ..................... 361/697 |
| 7,300,244 | B2 | * | 11/2007 | Baugh et al. .................. 415/119 |
| 7,424,907 | B2 | * | 9/2008 | Chou et al. ................... 165/80.4 |
| 7,775,062 | B2 | * | 8/2010 | Blomquist ................... 62/259.2 |
| 2002/0056544 | A1 | * | 5/2002 | Azar ............................ 165/80.3 |
| 2003/0209342 | A1 | * | 11/2003 | Hsin et al. .................... 165/80.3 |
| 2004/0212962 | A1 | * | 10/2004 | Ku ................................ 361/697 |
| 2009/0008067 | A1 | * | 1/2009 | Kuan ............................ 165/121 |
| 2009/0324411 | A1 | * | 12/2009 | Stanley et al. ................ 416/178 |

(Continued)

FOREIGN PATENT DOCUMENTS

| CN | 101060105 A | 10/2007 |
| CN | 101336061 A | 12/2008 |

(Continued)

*Primary Examiner* — Allen Flanigan
*Assistant Examiner* — Gustavo Hincapie Serna
(74) *Attorney, Agent, or Firm* — Jay Wahlquist; Robert Williams (57) ABSTRACT

According to embodiments of the invention, a structure for cooling electronic components may be provided. The structure may include a heat sink having a plurality of parallel heat conducting elements. The structure may also include a plurality of fans, wherein the fans are interleaved with the heat conducting elements. The structure may also include a drive shaft passing through the heat conducting elements and the fans, wherein the drive shaft rotates the fans in relation to the heat sink. According to other embodiments, the structure may include a baffle located on a side of the heat sink in an upstream location within an airflow stream.

4 Claims, 7 Drawing Sheets

(56) References Cited

U.S. PATENT DOCUMENTS

2010/0170660 A1* 7/2010 Wang et al. ............... 165/104.26
2011/0114296 A1* 5/2011 Horng et al. ............. 165/104.34
2011/0120679 A1   5/2011 Tanaka
2012/0000631 A1* 1/2012 Charamko et al. ....... 165/104.25

FOREIGN PATENT DOCUMENTS

| | | |
|---|---|---|
| CN | 201438805 U | 4/2010 |
| CN | 101090619 B | 5/2010 |
| JP | 5089538 B2 | 12/2012 |
| WO | 2011105800 A2 | 9/2011 |

* cited by examiner

INTERLEAVED HEAT SINK AND FAN ASSEMBLY

TECHNICAL FIELD

The field of the invention relates generally to cooling electronic components, and more specifically, to an electronic cooling device with interleaved heat sink and fan.

BACKGROUND

Computer systems typically include a combination of electronic components which generate heat during operation. This heat must be removed from these systems in order to maintain safe operating temperatures. The components within an overheated system generally exhibit a shorter maximum lifespan and may give sporadic problems. Cooling of these systems is typically accomplished by a heat sink, a fan, or a combination thereof.

SUMMARY

According to embodiments of the invention, a structure for cooling electronic components may be provided. The structure may include a heat sink having a plurality of parallel heat conducting elements. The structure may also include a plurality of fans, wherein the fans are interleaved with the heat conducting elements. The structure may also include a drive shaft passing through the heat conducting elements and the fans, wherein the drive shaft rotates the fans in relation to the heat sink. According to other embodiments, the structure may include a baffle located on a side of the heat sink in an upstream location within an airflow stream.

According to embodiments of the invention, a method of assembly of a structure for cooling electronic components may be provided. The method may include providing a heat sink having a plurality of parallel heat conducting elements. The method may also include placing a plurality of fans within the heat sink, wherein the fans are interleaved with the heat conducting elements. The method may also include passing a drive shaft through the heat conducting elements and the fans. According to other embodiments, the method may also include affixing a baffle to a side of the heat sink in an upstream location within an airflow stream.

DETAILED DESCRIPTION

A typical cooling system for an electronic component may consist of a heat sink in thermal communication with the electronic component and a fan adjacent to the heat sink. The heat sink may be designed to conduct heat from the electronic component, and the fan may improve that heat conduction by moving air over the heat sink. A typical heat sink configuration has multiple, parallel heat conducting elements, such as fins, affixed to a base plate. The fins may have channels between them to allow for the flow of air around each fin. The fan may be positioned to move air through those channels. However, this system may suffer from inefficiency due to the distance from the fan to the areas of the heat sink with the highest level of heat dissipation, most notably the base of the fins.

Embodiments of the invention provide a cooling system consisting of a heat sink and fan assembly having interleaved fins of the heat sink and fans. Interleaving the fins of the heat sink and the fans may allow for a higher flow rate of air near the base of the fins, thereby increasing the ability of the assembly to dissipate heat. The efficiency of the assembly may also be improved by controlling the location and direction of the cool air intake of the assembly in order to assure that cooler air is present at the air intake. This may be accomplished by way of a baffle or any other means of directing airflow.

Figure 1:
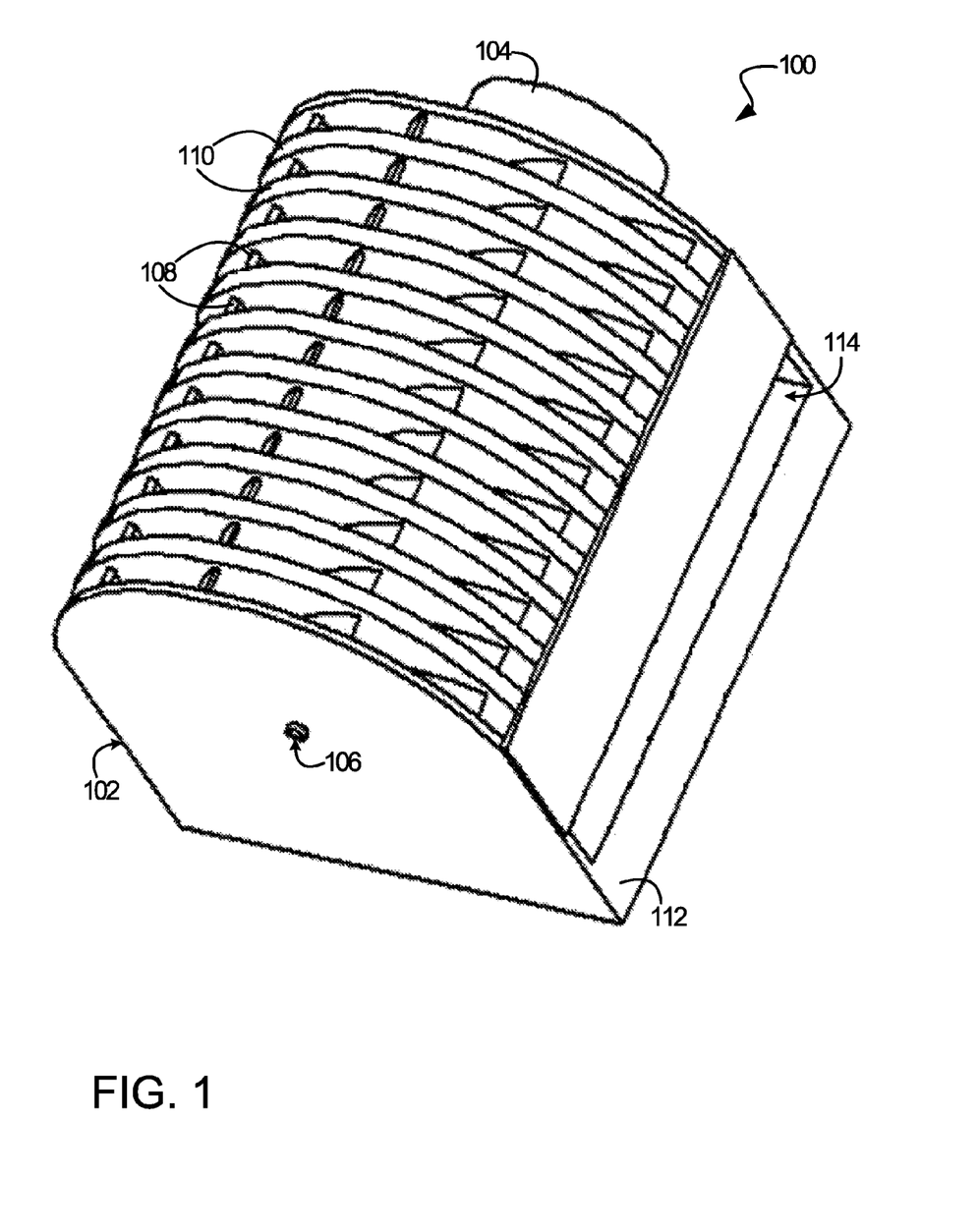
FIG. 1 is an isometric view of a cooling system, according to various embodiments of the invention.

Referring to the drawings, wherein like numbers denote like parts throughout the several views, FIG. 1 is an isometric view of a cooling system 100, according to various embodiments of the invention. The cooling system 100 may include a heat sink 102, a motor 104, a drive shaft 106, and a plurality of fans 108. The heat sink 102 may include multiple, parallel, heat conducting elements 110, such as fins, mounted to a base plate 112. The base plate 112 may be adapted affix to any electronic component which may require cooling. The heat sink 102 may be made from any heat conducting material such as aluminum. The heat sink 102 may also include a baffle 114 or any other airflow-directing device to provide a cool air intake to the heat sink 102. The baffle 114 may be located on a side of the heat sink 102 in an upstream location within an airflow stream. In various embodiments, cool air may enter the heat sink at the baffle 114 and exit the heat sink anywhere along the curved section of the heat sink 102.

The motor 104 may be mounted on a side of the heat sink 102. The drive shaft 106 may be connected to the motor 104 at one end and the heat sink 102 at the other end. The drive shaft 106 may also pass through the heat sink 102 in a direction which is perpendicular to the fins 110. The fans 108 may be attached to the drive shaft 106. The fans 108 may be interleaved with the fins 110. Interleaving fins 110 and fans 108 may include having a fan 108 in between each set of fins 110. In various embodiments, each individual fan 108 may be adapted so that as it is rotating it passes through nearly the whole channel within which it is placed, thereby providing a near maximum amount of airflow within that channel. A more detailed depiction of a single fan 108 is shown in FIG. 5

Figure 2:
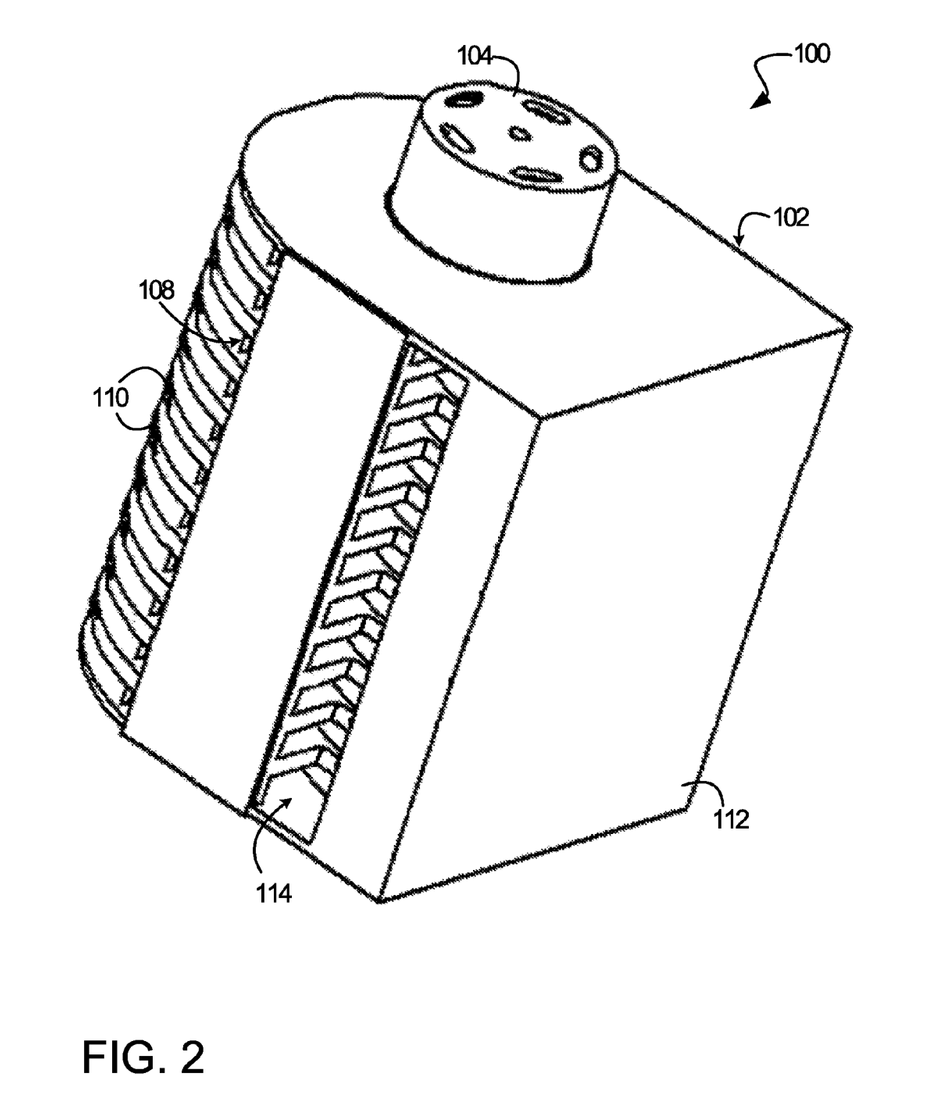
FIG. 2 is an alternate isometric view of the cooling system of FIG. 1, according to various embodiments of the invention.
Figure 3:
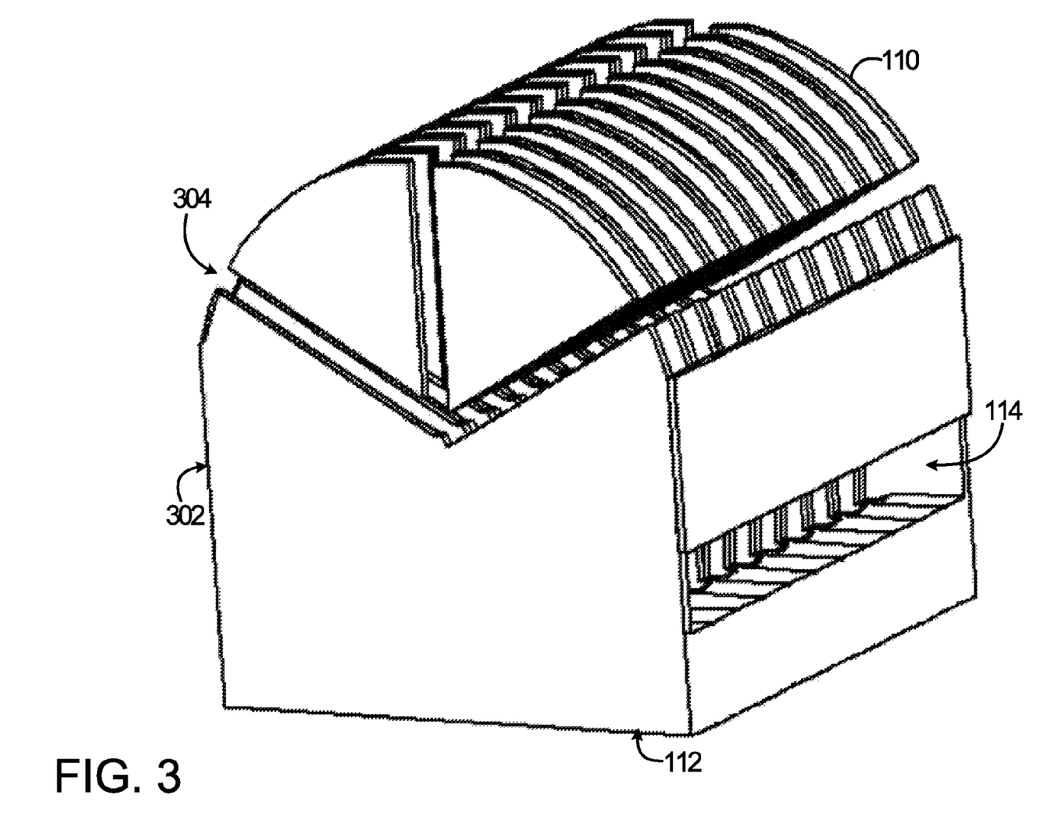
FIG. 3 is an isometric view of an alternate heat sink of the cooling system, according to various embodiments of the invention.

FIG. 2 is an alternate isometric view of the cooling system 100 of FIG. 1, according to various embodiments of the invention. As in FIG. 1, this view shows the heat sink 102, the motor 104, the fans 108, the fins 110, the base plate 112, and the baffle 114. In various embodiments, the area of the heat sink 102 adjacent to the baffle 114 may be removed to improve airflow. The fans 108 may pass through this area and draw cool air by way of a type of scooping action FIG. 3 is an isometric view of an alternate heat sink 302 of the cooling system 100, according to various embodiments of the invention. The alternate heat sink 302 may include a base plate 112, fins 110 and a baffle 114. The alternate heat sink 302 may also include one or more slots 304 located in the fins 110. These slots may improve the heat dissipative properties of the alternate heat sink 302. In various embodiments these slots 304 may extend from very near the center of the fins 110 to the periphery of the fins 110. In other embodiments, the slots 304 may not extend to the periphery of the fins 110 in such a way that the slots 304 may be similar to holes. In other embodiments, the slots 304 may be located on a relatively small portion of the fins 110. The slots 304 may be of any size and may be of any shape, such as straight or curved. In FIG. 3, certain sections of the fins 110 created by the slots 304 may appear to be separate from each other and their corresponding fins 110, but this is for illustration purposes only and these sections would be mechanically affixed to their corresponding fins 110 where appropriate.

Figure 4:
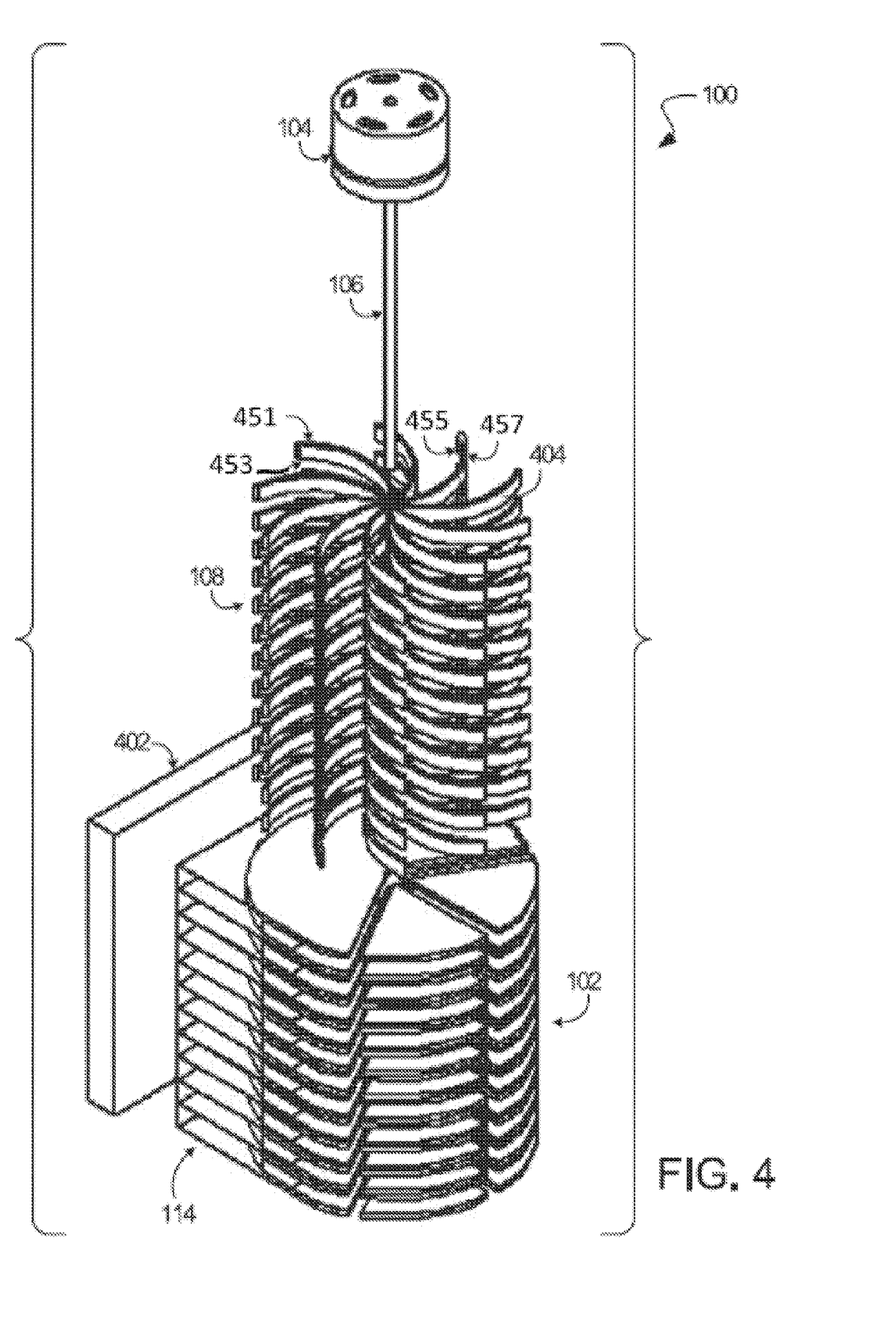
FIG. 4 is an exploded, isometric view of a cooling system, according to various embodiments of the invention.

FIG. 4 is an exploded, isometric view of a cooling system 100, according to various embodiments of the invention. This view depicts the various elements of the cooling system 100 in an exploded position to better illustrate the individual components of the cooling system 100. As previously mentioned, the cooling system 100 may include the heat sink 102, the motor 104, the drive shaft 106, and the fans 108. In various embodiments, the fans 108 may have fan blades 404 curved in the direction of the rotation of the drive shaft 106. This curved shape may serve to scoop cool air from the baffle 114. In other embodiments, the fan blades 404 may be straight or curved in the direction opposite the rotation of the drive shaft 106. Each fan blade 404 includes a top side 451, a bottom side 453, a front side 455, and a back side 457. Also depicted is a representation of an electronic component 402 in order to show where an electronic component may be positioned in relation to the heat sink 102. The electronic component 402 may be any heat generating electronic component such as a microprocessor.

Figure 5:
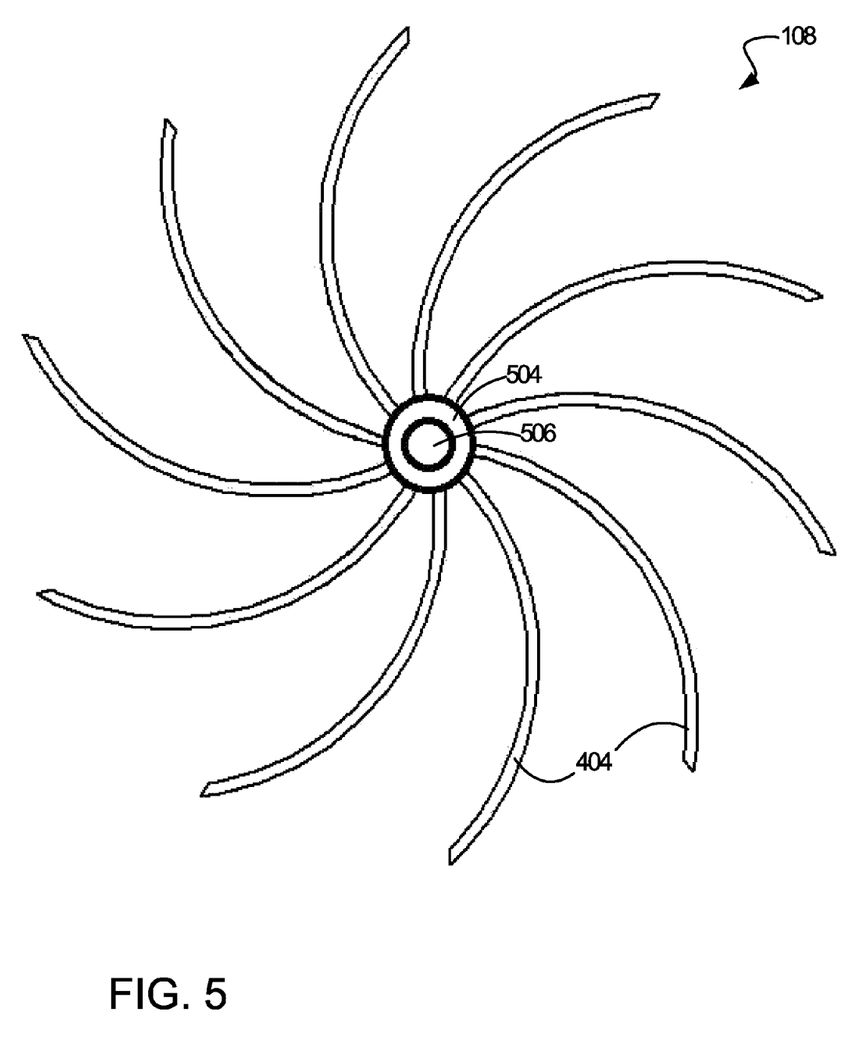
FIG. 5 is a side view of a fan, according to various embodiments of the invention.

FIG. 5 is a side view of a fan 108, according to various embodiments of the invention. The fan 108 may include a plurality of fan blades 404. As previously stated, the fan blades 404 may be curved or straight. The fan 108 may also include a ring 504 at the center of the fan 108 to which the fan blades 404 are attached. The ring 504 may have an aperture 506 through which the drive shaft 106 passes. Although not depicted, the aperture 506 and the drive shaft 106 may have mating components that allow a mechanical force to be transferred from the drive shaft 106 to the fan 108. Manufacturing the fans 108 and the drive shaft 106 as separate components allows for the assembly of the fans 108, the drive shaft 106, and the heat sink 102. An example of an assembly process may include placing a fan 108 in between each set of fins 110 of the heat sink 102 and then passing the drive shaft through the fans 108 and the fins 110. Another example of an assembly process may include manufacturing the fans 108 and drive shaft 106 as one component and then passing the drive shaft through a single slot 304 until it reaches the center of the fins 110.

Figure 6:
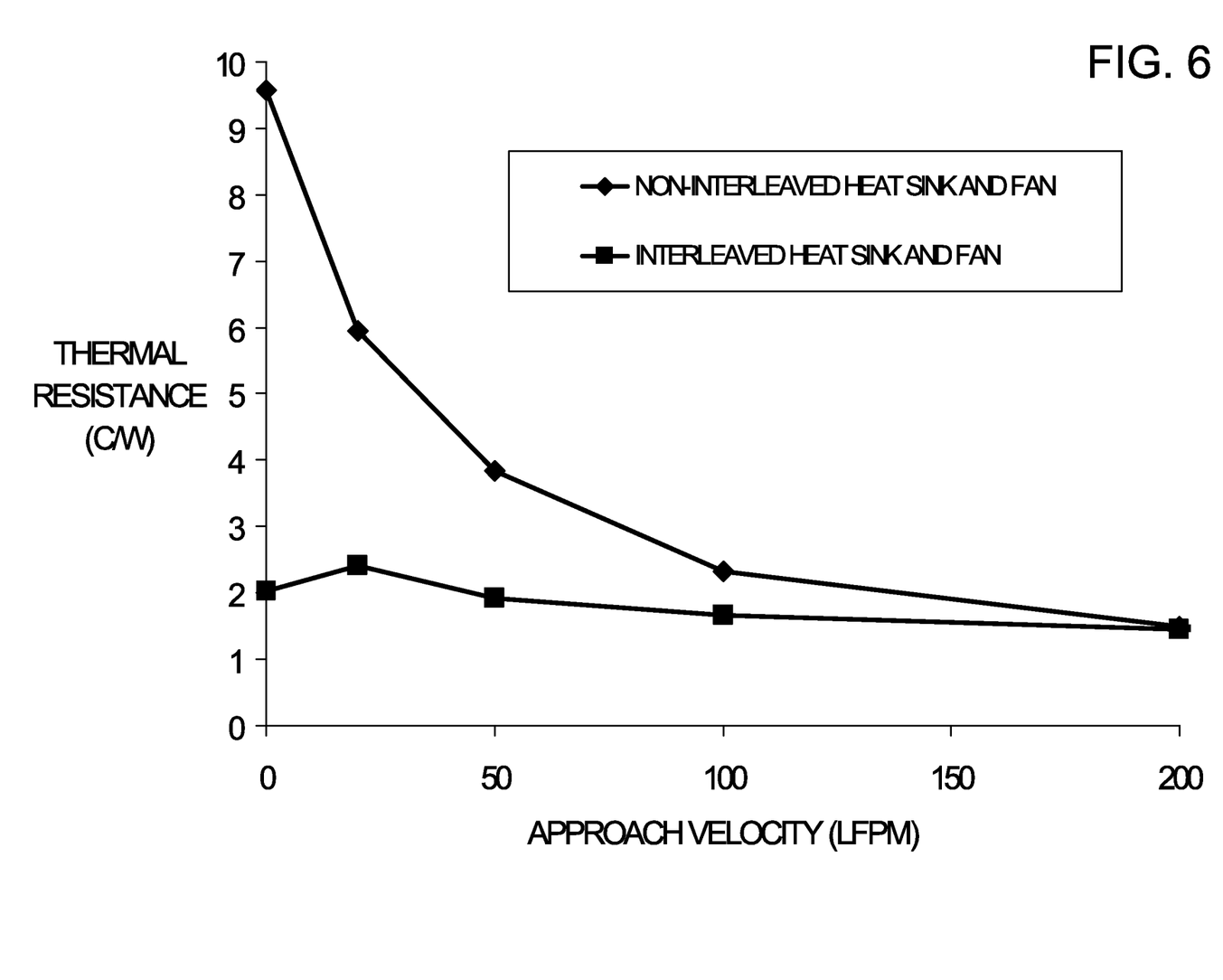
FIG. 6 is a graph showing a comparison of the thermal resistance of a normal fan and heat sink and an interleaved fan and heat sink.

FIG. 6 is a graph showing a comparison of the thermal resistance of a non-interleaved heat sink and fan assembly and an interleaved heat sink and fan assembly. The data for this graph was generated using computer-aided engineering simulation software. The horizontal axis shows approach velocity of air in linear feet per minute and the vertical axis shows thermal resistance in degrees Celsius per Watt. Thermal resistance may be considered a measure of an objects resistance to the flow of heat. The approach velocity may be considered a measure of the amount of airflow present through the assembly. The graph shows that the interleaved heat sink and fan assembly has a lower thermal resistance at lower airflows. This indicates an increase in the efficiency of the structure in the dissipation of heat. This increase in efficiency may be due to high velocity air vectors being closer to the base of the heat sink, and removing heat closer to the source rather than the extremities of the heat sink.

Figure 7:
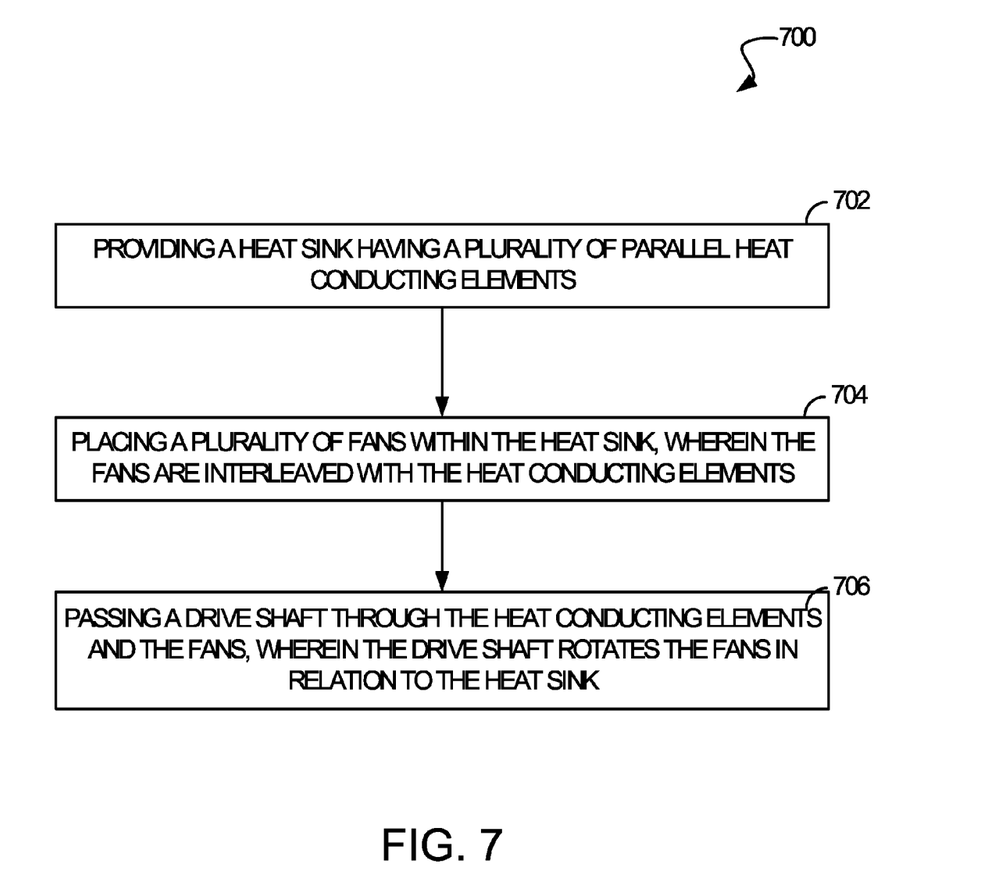
FIG. 7 is a flowchart of a method of assembly of a cooling system for electronic components, according to various embodiments of the invention.

FIG. 7 is a flowchart of a method of assembly 700 of a cooling system for electronic components, according to various embodiments of the invention. Block 702 may contain the operation of providing a heat sink. The heat sink may be the heat sink 102, the heat sink 302, or any other similar heat sink. As previously stated, the heat sink may have a plurality of heat conducting elements such as fins. Also as previously stated, the heat conducting elements may include one or more slots through at least a portion of the heat conducting elements Block 704 may contain the operation of placing a plurality of fans within the heat sink. The fans may be the fans 108 or any other similar fans. As previously stated, the fans may be interleaved with the heat conducting elements. Also as previously mentioned, the fans may include a plurality of fan blades which are curved in a forward direction in relation to a direction of rotation. Block 706 may contain the operation of passing a drive shaft through the heat conducting elements and the fans. The drive shaft may be the drive shaft 106 or any other similar drive shaft. In various embodiments, the method of assembly 700 may also include affixing a baffle to a side of the heat sink in an upstream location within an airflow stream. This baffle may be the baffle 114 or any other similar baffle or airflow-directing device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An assembly for cooling electronic components comprising:
    a heat sink having a casing with a plurality of parallel heat conducting fins, wherein each of the parallel heat conducting fins is mounted to a flat baseplate and includes a respective curved side that is oriented perpendicular to the flat baseplate;
    a plurality of fans, wherein each fan includes a plurality of fan blades curved in a forward direction in relation to a direction of rotation of a drive shaft, the fan blades having a front side and a back side oriented perpendicular to the direction of rotation of the drive shaft and a top side and a bottom side oriented parallel to the direction of rotation of the drive shaft and the fans are interleaved with the heat conducting fins; and
    the drive shaft passing through the heat conducting fins and the fans, wherein the drive shaft rotates the fans in said rotation direction in relation to the heat sink;
    wherein each of the heat conducting fins includes one or more slots, each of the one or more slots extending from a periphery of the respective curved side toward a center of the heat conducting fin.

2. The assembly of claim 1, further comprising a baffle located on a side of the heat sink in an upstream location within an airflow stream.

3. A method of assembly comprising:
    Providing a heat sink having a casing with a plurality of parallel heat conducting fins, wherein each of the parallel heat conducting fins is mounted to a flat baseplate and includes a respective curved side that is oriented perpendicular to the flat baseplate;

placing a plurality of fans within the heat sink, wherein each fan includes a plurality of fan blades curved in a forward direction in relation to a direction of rotation of a drive shaft, the fan blades having a front side and a back side oriented perpendicular to the direction of rotation of the drive shaft and a top side and a bottom side oriented parallel to the direction of rotation of the drive shaft and the fans are interleaved with the heat conducting fins; and passing a drive shaft through the heat conducting fins and the fans, wherein the drive shaft rotates the fans in said rotation direction in relation to the heat sink;

wherein each of the heat conducting fins includes one or more slots, each of the one or more slots extending from a periphery of the respective curved side toward a center of the heat conducting fin.

4. The method of claim 3, further comprising affixing a baffle to a side of the heat sink in an upstream location within an airflow stream.

\* \* \* \* \*